(12) United States Patent
Meissner

(10) Patent No.: US 8,857,202 B1
(45) Date of Patent: Oct. 14, 2014

(54) HIGH DENSITY MODULAR INTEGRATED COOLING SYSTEM AND METHODS OF OPERATION THEREOF

(75) Inventor: Alan P. Meissner, Franklin, WI (US)

(73) Assignee: Silver Linings Systems, LLC, Kenosha, WI (US)

( * ) Notice: Subject to any disclaimer, the term of this patent is extended or adjusted under 35 U.S.C. 154(b) by 501 days.

(21) Appl. No.: 13/071,980

(22) Filed: Mar. 25, 2011

Related U.S. Application Data

(60) Provisional application No. 61/317,503, filed on Mar. 25, 2010.

(51) Int. Cl.
*F25D 23/12* (2006.01)

(52) U.S. Cl.
USPC .............................. 62/259.1; 62/426; 62/454

(58) Field of Classification Search
CPC ............ F24F 13/20; F24F 1/02; F24F 1/0007
USPC ......... 62/259.1, 426, 454, 515; 312/129, 130; 454/91, 99
See application file for complete search history.

(56) References Cited

U.S. PATENT DOCUMENTS

| | | | | |
|---|---|---|---|---|
| 3,088,575 A | * | 5/1963 | Ferro | 198/721 |
| 3,291,280 A | * | 12/1966 | Thomas et al. | 198/465.3 |
| 3,777,506 A | * | 12/1973 | Hergatt et al. | 62/237 |
| 6,632,995 B1 | * | 10/2003 | Knieriem | 174/50 |
| 7,727,059 B2 | * | 6/2010 | Merino | 454/184 |
| 7,957,132 B2 | * | 6/2011 | Fried | 361/679.47 |
| 2005/0137824 A1 | * | 6/2005 | Augustin et al. | 702/132 |
| 2005/0235671 A1 | * | 10/2005 | Belady et al. | 62/259.2 |
| 2006/0059840 A1 | * | 3/2006 | Taylor | 52/633 |
| 2008/0309107 A1 | * | 12/2008 | Taylor | 296/3 |
| 2009/0139245 A1 | * | 6/2009 | Blackway et al. | 62/3.62 |
| 2009/0260391 A1 | * | 10/2009 | Shioyama et al. | 62/531 |
| 2010/0049338 A1 | * | 2/2010 | Schmitt | 700/28 |

* cited by examiner

*Primary Examiner* — Mohammad M Ali
(74) *Attorney, Agent, or Firm* — Brannen Law Office, LLC

(57) ABSTRACT

A module is provided having a foundation and a skeleton that are structural and modular in design. The skeleton can be constructed on top of the foundation. The skeleton supports an HVAC assembly. Equipment racks, such as a server racks, can be housed within the module and independently movably supported by translation assemblies. The translation assemblies are embedded within the foundation and skeleton. Any number of modules can be attached end to end to form a system of a desired length, side to side to form a system of a desired width, or vertically to form a system of desired height. The entire system, once assembled and wired, can easily be conjoined or moved to a desired destination. The air flow path within the module is selected by the operator. The system is expandable in size and capacity as the operational needs increase.

19 Claims, 8 Drawing Sheets

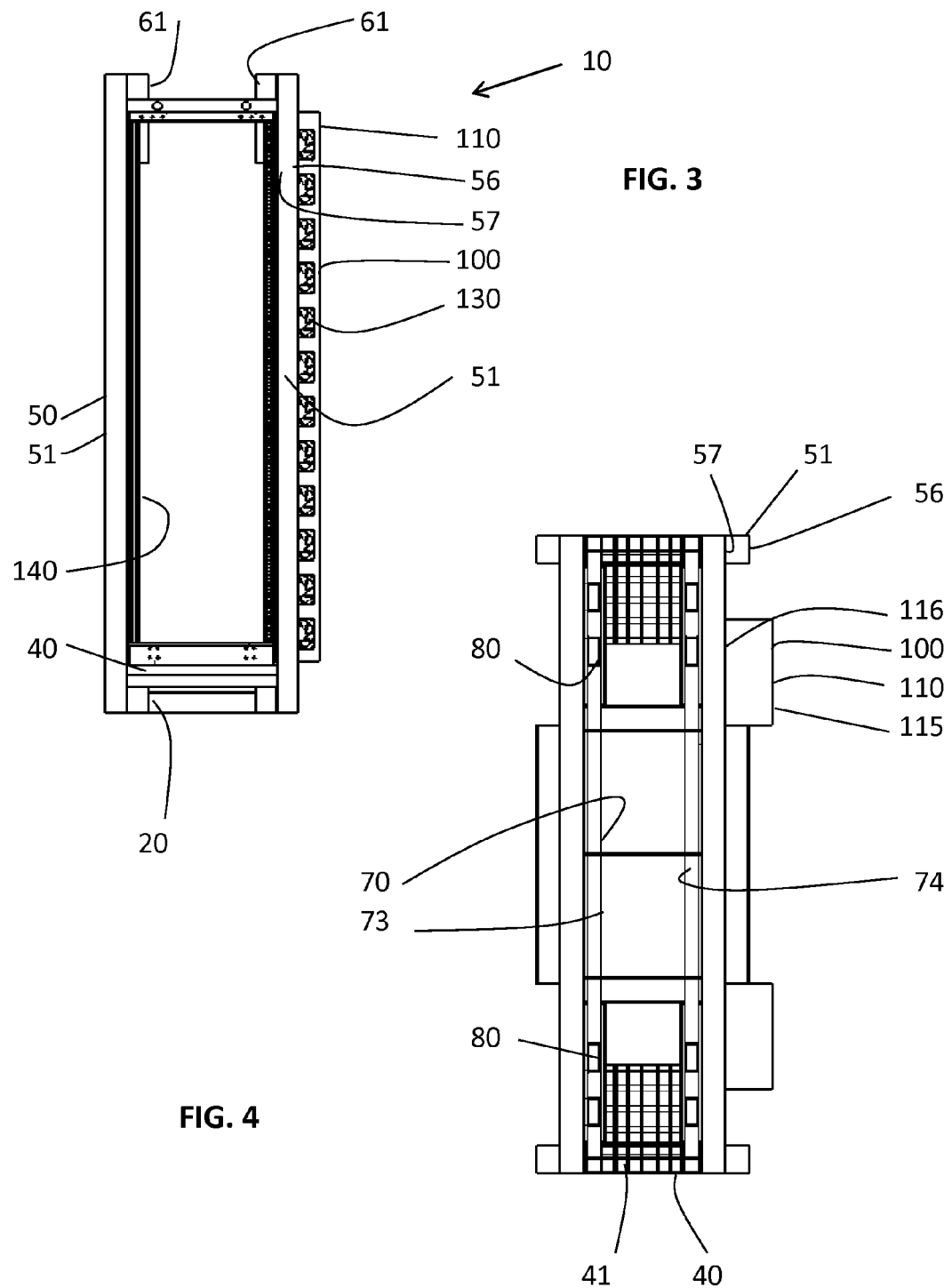

HIGH DENSITY MODULAR INTEGRATED COOLING SYSTEM AND METHODS OF OPERATION THEREOF

This United States utility patent application claims priority on and the benefit of provisional application 61/317,503 filed Mar. 25, 2010, the entire contents of which are hereby incorporated herein by reference.

BACKGROUND OF THE INVENTION

1. Field of the Invention

The present invention relates to cooling system capable efficiently cooling equipment arranged in a highly dense manner, that is modular in design, is flexible in air flow configuration, has integrated cooling components and that can be selectively used in mobile and/or stationary environments.

2. Description of the Related Art

Cooling of electronic equipment is a major concern for proper operation of the equipment. No matter the equipment type (servers, telecommunication, medical imaging devices, acoustic components, circuits and/or otherwise), heat dissipation is a primary design and operational concern. Fortunately, many solutions are available when the equipment is used in a stand-alone environment. One solution is to rely on the ambient air to cool the equipment. Internal fans on board the equipment may provide additional convective cooling in this endeavor in existing systems.

However, the challenges of keeping the equipment within preferred operational temperatures increases along with the density requirements of the electronic system equipment. These challenges can relate to operating the equipment at a consistent and low temperature in order to maximize equipment life and reliability.

In one particular situation, there is a desire to have many servers confined within a single space. Such a space is typically called a server room on a small scale and a data center on a larger scale. There is a need to have modular server rooms and data centers that can be expanded as the user's requirements grow. There is also a need to have a server room or data center that can be transported from one location to another (from simply across a facility to all the way across international boundaries).

One commercially available existing system utilizes segregated in-row side by side components. While this system may be acceptable for its intended purposes, several improvements may be made.

For example, the density of the existing system can be improved.

Further, the existing system appears to operate by simply placing the components adjacent to each other. No infrastructure appears to be provided for securing the components in a desired position relative each other, either vertically, laterally or otherwise.

Related, no infrastructure appears to be provided in the existing system for transporting an assembled system from one location to another, or using the assembly in either a stationary or mobile environment.

Still further, the existing system does not structurally support and safeguard the HVAC assembly.

Still further yet, the existing system is neither laterally nor vertically modular, and does not contain a load bearing structural skeleton.

Still further yet, no infrastructure appears to be provided in the existing system for selectively drawing fresh external air when doing so will result in operational efficiencies compared to cooling recirculated air.

Thus, there exists a need for a high density modular cooling system and methods of operation thereof that solves these and other problems.

SUMMARY OF THE INVENTION

The present invention relates to cooling system capable of efficiently cooling equipment arranged in a highly dense manner, that is modular in design, is flexible in air flow configuration, has integrated cooling components and that can be used and easily transported in a mobile environment and/or be used in a stationary environment.

According to one embodiment of the present invention, a module is provided having a foundation and a skeleton that are modular and structural in design. The skeleton can be constructed on top of the foundation. The skeleton supports an HVAC assembly, which includes a plenum, a heat exchanger and air movers such as fans. Translation assemblies are embedded within the foundation and skeleton. Equipment racks, such as server racks, can be housed within the module and movably supported by the translation assemblies. The translation assemblies allow the equipment racks to independently move within the module to provide access to either the front or back of the equipment racks, as desired.

Any number of modules can be attached end to end to form a system of a desired length, side to side to form a system of a desired width, or vertically to form a system of desired height. The entire system, once assembled and wired, can easily be conjoined and moved to a desired destination such as within a container. Alternatively, the entire system can be sheathed for use as a stand-alone structure independent of a separate container.

The system can also be expanded in size and capacity as the operational needs increase. In this regard, the system is operationally scalable as necessary and when necessary in that it can be expanded end to end, side to side and/or vertically after it is operational.

According to a further advantage of the present invention, the skeleton both supports and safeguards the HVAC assemblies. In this regard, the width of the HVAC assembly can, in one embodiment, be equal to or less than twice as wide as the width of the skeleton vertical members. The HVAC assemblies are nested between the cross members of adjacent modules, wherein longitudinal arrangement of modules results in the HVAC assemblies being securely located within the overall assembly without risk of being crushed or damaged in other ways.

According to a further advantage of the present invention, the translation assemblies provide access for maneuverability, serviceability and/or electronic component replacement. Specifically, and without limitation, a full depth server can be replaced within the present invention. Also, the location of the components within the module can be precisely situated for optimum heat dissipation and segregation from liquids.

According to another advantage of the present invention, the structure can be made of a variety of materials selected for strength, weight and economic reasons. Two such materials are steel and aluminum.

According to another advantage of the present invention, each module is designed for individual or modularly linked uses. When a linked assembly is desired, the selected number of modules, each with individual foundation and skeleton, are simply connected together with bolts or other types of removable fasteners in an end to end longitudinal arrangement, in a side to side lateral arrangement, and/or in a vertically stacked arrangement.

According to a still further advantage of an embodiment of the present invention, the equipment can be installed before walls or insulating devices are put in place. The electronic equipment can be assembled and wired when the foundation is outside of a container. A fork lift or other transport device such as an overhead lift can then be used to move the full assembly into a container after assembly is accomplished. Examples of the many possible containers are, without limitation, HI-Cube ISO containers, standard shipping containers, rail cars, on site drop over covers and preexisting shelters. Still further, the present invention can be fitted with sheathing, such as insulated wall panels, for stand-alone applications independent of an external container without departing from the broad aspects of the present invention.

According to a still further advantage yet of the present invention, the equipment housed within the equipment racks is segregated from the cooling elements. This can be accomplished by running the piping under floor sections and by utilizing floor sections with openings there through. This advantageously allows for any liquid that may be present to fall through the openings and be collected remote from the equipment. Thus, there is a decreased risk of liquid coming into contact with the electronics.

According to still further advantage yet of one embodiment of the present invention, three thermally distinct aisles can be provided within each module. This advantageously allows workers to have access to both sides of the equipment even when the equipment is located inside a container. Further, the operator can select the desired air flow pattern which results in either two hot aisles and a combined cold aisle, or alternatively two cold aisles with a combined hot aisle.

According to a still further advantage yet of the present invention, the equipment may optionally be loaded and serviced from either side of the equipment racks, respectively. In this regard, access to the equipment housed within the equipment racks can be provided either external of or internal of the module.

According to a still further advantage of the present invention, several modes of operation can be utilized. For example, the air can be re-circulated, cooled (examples such as direct cooling and direct expansion), humidified, or simply drawn and filtered from the environment and passed through the system and/or a combination or mixture thereof, as desired. In one operational embodiment where a combination of these modes is desired, a real time feedback control can be used to sense environmental conditions and make electro-mechanical adjustments to the system to achieve necessary and desired heat dissipation.

Other advantages, benefits, and features of the present invention will become apparent to those skilled in the art upon reading the detailed description of the invention and studying the drawings.

BRIEF DESCRIPTION OF THE DRAWINGS

FIG. 3 is a side view of the preferred embodiment illustrated in FIG. 1.

FIG. 4 is a top view of the preferred embodiment illustrated in FIG. 1.

DETAILED DESCRIPTION OF PREFERRED EMBODIMENTS

Figure 1:
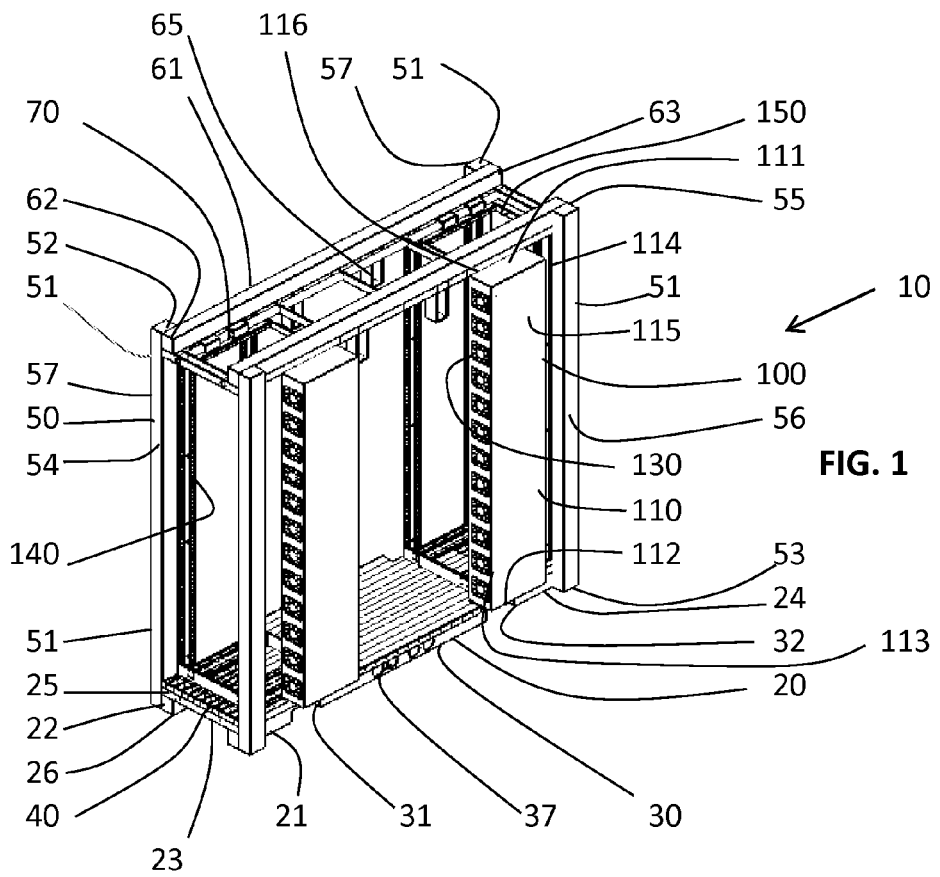
FIG. 1 is a perspective view of a preferred module of the present invention.

While the invention will be described in connection with one or more preferred embodiments, it will be understood that it is not intended to limit the invention to those embodiments. On the contrary, it is intended to cover all alternatives, modifications and equivalents as may be included within the spirit and scope of the invention as defined by the appended claims.

Turning now to FIGS. 1-4, it is seen that a preferred embodiment is illustrated. The modular system module 10 preferably has a foundation 20, a skeleton 50, and an HVAC assembly 100.

The foundation 20 can be made of aluminum, steel or any other strong material without departing from the broad aspects of the present invention. Foundation 20 has end 21 and end 22, side 23 and side 24, top 25 and bottom 26. Joists 30 perpendicularly span between sides 23 and 24. A transport assembly, such as fork pockets 31 and 32, is provided. It is appreciated that other types of transport assemblies may be used without departing from the broad aspects of the present invention. Piping 37 preferably spans longitudinally through the foundation 20, and are preferably centrally aligned between sides 23 and 24. Two sets of piping are provided, one set for each of the two HVAC assemblies within each module. It is understood that the piping 37 could be located at other locations without departing from the broad aspects of the present invention.

It is appreciated that a fork lift can be used to load and/or unload a module 10 or series of linked modules from a container or location, or to vertically stack modules or series of linked modules. It is further appreciated that the bottom 26 of the foundation 20 can aid in sliding of the module relative the floor or container bottom. Also, bolts or other fasteners may be used to secure the foundation to the floor or container bottom.

Figure 5:
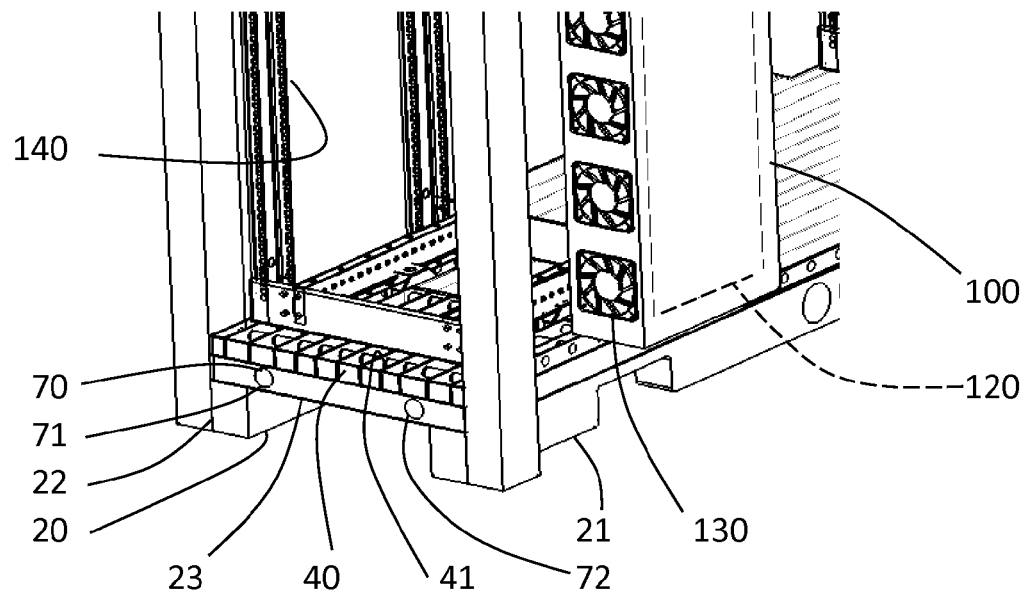
FIG. 5 is close up perspective view showing a lower portion of the equipment rack relative the foundation and skeleton.
Figure 6:
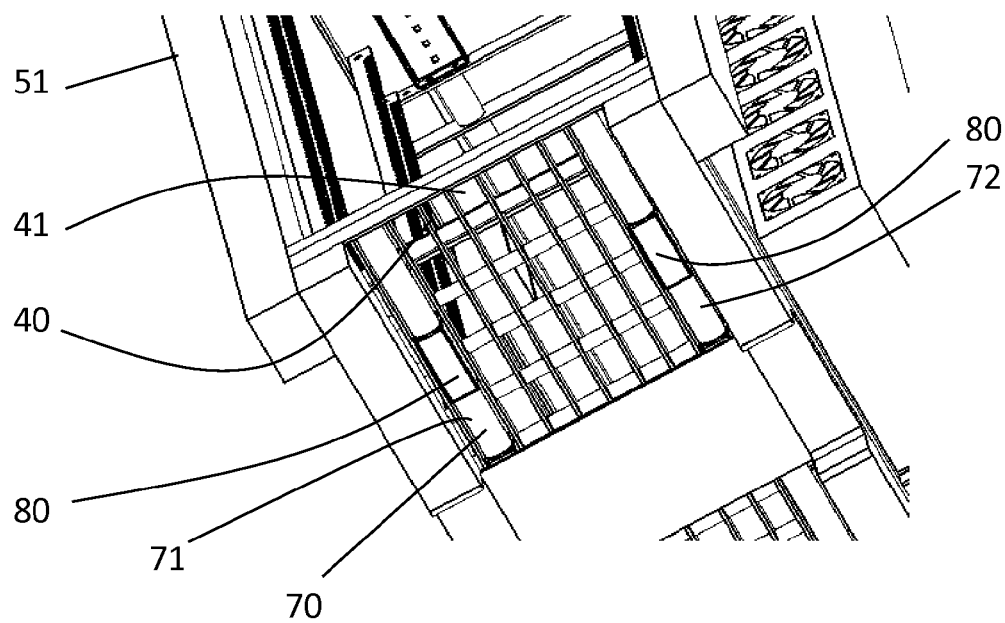
FIG. 6 is a close up underneath perspective view showing a portion of a preferred translation assembly.

Keeping with FIGS. 1-4, and also looking at FIGS. 5 and 6, it is seen that a floor 40 is provided. It is understood that the floor 40 can have holes there through. The holes allow any moisture, liquid, dirt or other relatively small item to pass through the holes to move to a location remote from the equipment.

It is also seen that a skeleton 50 is provided. Skeleton 50 is preferably comprised of several uprights 51, each having a top 52 and a bottom 53, sides 54 and 55, and a front 56 and a back 57. The uprights 51 are preferably generally parallel to each other and perpendicular to the joists 30. Cross members 61 are also provided. The cross members 61 each have ends 62 and 63, respectively, and are preferably generally parallel to each other and perpendicular to the uprights 51. Hangers 65 can be provided and supported by the cross members 61.

The foundation 20 and skeleton 50 combine to form robust structures. It is specifically noteworthy that the skeleton uprights 51 are load bearing structural members.

A translation assembly 70 is also provided, and is best seen in FIGS. 1, 4, 5 and 6. The translation assembly 70 is preferably comprised of two upper shafts 71 and 72, and two lower shafts 73 and 74. Each of the shafts 71, 72, 73 and 74 are preferably stationary shafts, and are fixed with respect to the skeleton 50 and foundation 20, respectively. Each of the shafts are parallel to each other, and are preferably parallel to the cross members 61 of the skeleton. Several carriers 80 are also provided. The carriers 80 move relative the shafts, and support equipment racks (which are described below). Each equipment rack is preferably supported by carriers at four points and is independently movable. It is appreciated that the carriers 80 can be manually operable, or alternatively operable under the mechanical driving force of actuators or motors. It is appreciated that there are many ways to affect movement of the carriers relative the shafts without departing from the broad aspects of the present invention.

An HVAC assembly 100 is further provided, and is best illustrated in FIGS. 1, 4 and 5. One preferred HVAC assembly 100 has a plenum 110, a heat exchanger 120 and air movers such as fans 130. Plenum 110 has a top 111 and a bottom 112, ends 113 and 114, and sides 115 and 116. The plenum 110 houses the heat exchanger 120 and also collects any condensate material. While a plurality of fans 130 are provided at the ends 113 and 114 of the plenum 110, respectively, it is understood that any suitable type of air mover may be utilized without departing from the broad aspects of the present invention. The fans 130 are selectably operable to direct a flow of air in either of a first direction or a second direction across the heat exchanger 120 parallel to plenum sides 115 and 116. This is accomplished in the preferred embodiment by having two banks of fans 130, one on each end 113 and 114 of the plenum 110, respectively.

Figure 2:
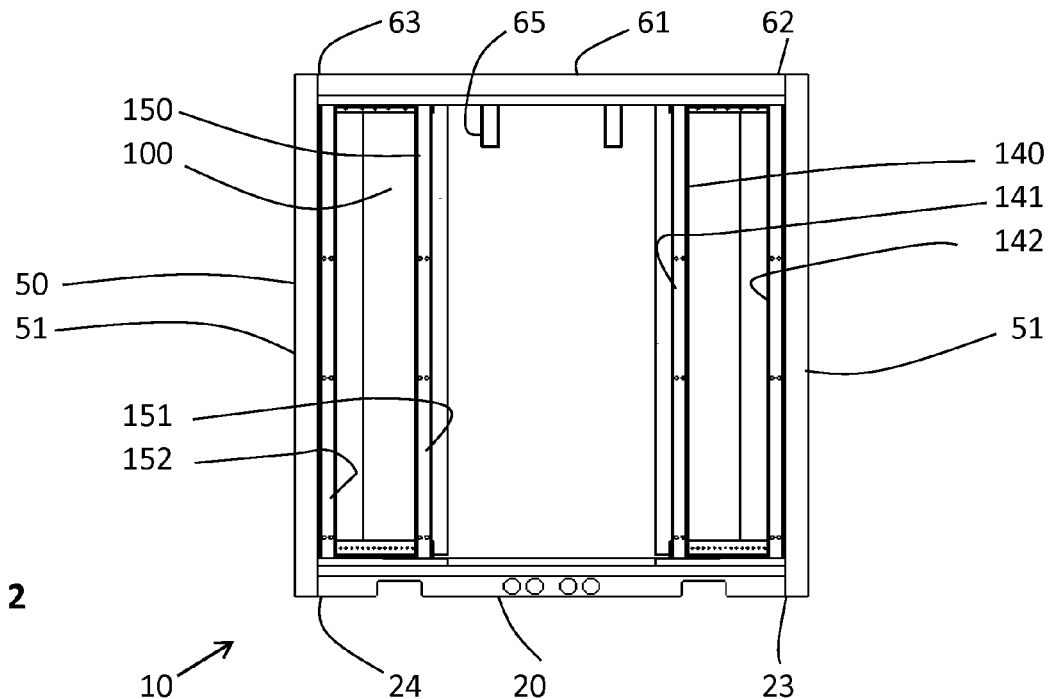
FIG. 2 is an end view of the preferred embodiment illustrated in FIG. 1.

Turning now back to FIGS. 1-3, it is seen that equipment racks 140 and 150 are provided. Equipment rack 140 has a front 141 and a rear 142, and equipment rack 150 has a front 151 and a rear 152. One type of rack is a server rack. However, it is appreciated that other types of racks for other types of equipment needing to be cooled can be used without departing from the broad aspects of the present invention. It is appreciated that while an equipment rack is illustrated, it is not intended to be limiting in any way. Any cabinet or other structure may be utilized without departing from the broad aspects of the present invention. It is further appreciated that the broad aspects of the present invention are applicable even in embodiments without a traditional rack.

Figure 11:
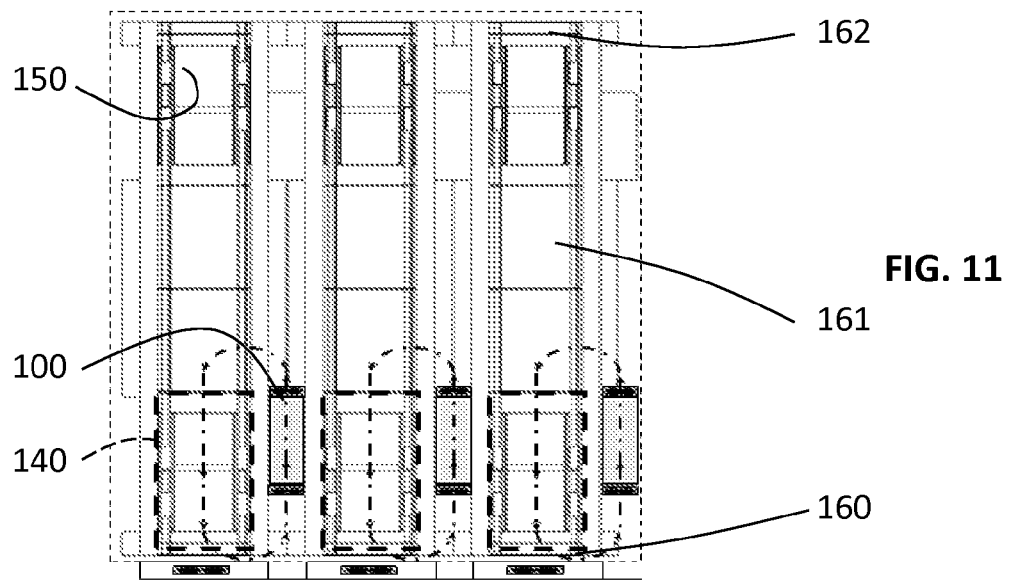
FIG. 11 is a top view of several linked modules showing an air flow recirculation pattern within the module.

Looking now at FIG. 11, it is seen that three distinct aisles 160, 161 and 162 are provided, and are separated by the equipment racks 140 and 150. Depending on the flow of air, there can be either two hot aisles with a combined cold aisle, or two cold aisles with a combined hot aisle. Specifically in FIG. 11, it is seen that an embodiment with two hot aisles 160 and 162 and one cold aisle 161 is illustrated. Yet, it is appreciated that the flow could be reversed resulting in two cold aisles and one hot aisle without departing from the broad aspects of the present invention. It is further appreciated that the operator determines the air flow pattern and hence the configuration of the hot and cold aisles. Internal fans on board the equipment being cooled may aid in creating the air flow path. Or, as an alternative, the payload equipment internal on board fans may be disabled and the air flow path can be created by the banks of fans 130 of the HVAC assemblies 100.

Figure 12:
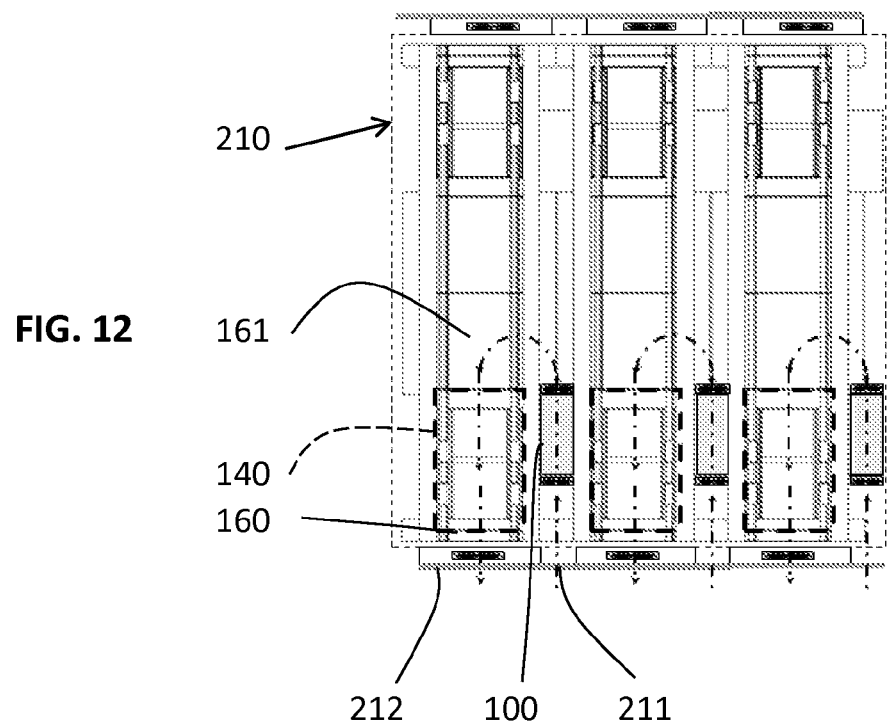
FIG. 12 is a top view of several linked modules showing an air flow pattern with a fresh air intake and an exhaust.

Turning now to FIG. 12, it is seen that several linked modules 210, each with a fresh air intake 211 and an exhaust 212 are provided. In this embodiment, the fresh air enters through the intake 211, passes through a filter, passes through the HVAC assembly 100 (which may or may not be operational depending on the environmental conditions of the air drawn through the air intake 211), enters the cold aisle 161, passes through the equipment rack 140, enters the hot aisle 160, and then exits through exhaust 212. The air can be moved across the equipment housed within the equipment racks by either an exhaust fan on the module, fans on board the equipment housed in the equipment racks, or a combination of both. Environmental conditions can be used to the advantage of the operator when the ambient environmental air temperature is less than the air temperature after the air passes through the equipment held in the equipment rack. In this regard, the fresh air intake may be preferred when ambient environmental air is cooler than the otherwise recirculated air, and therefore requires less cooling (compared to the recirculated air) to achieve the desired cold aisle temperature.

Figure 7:
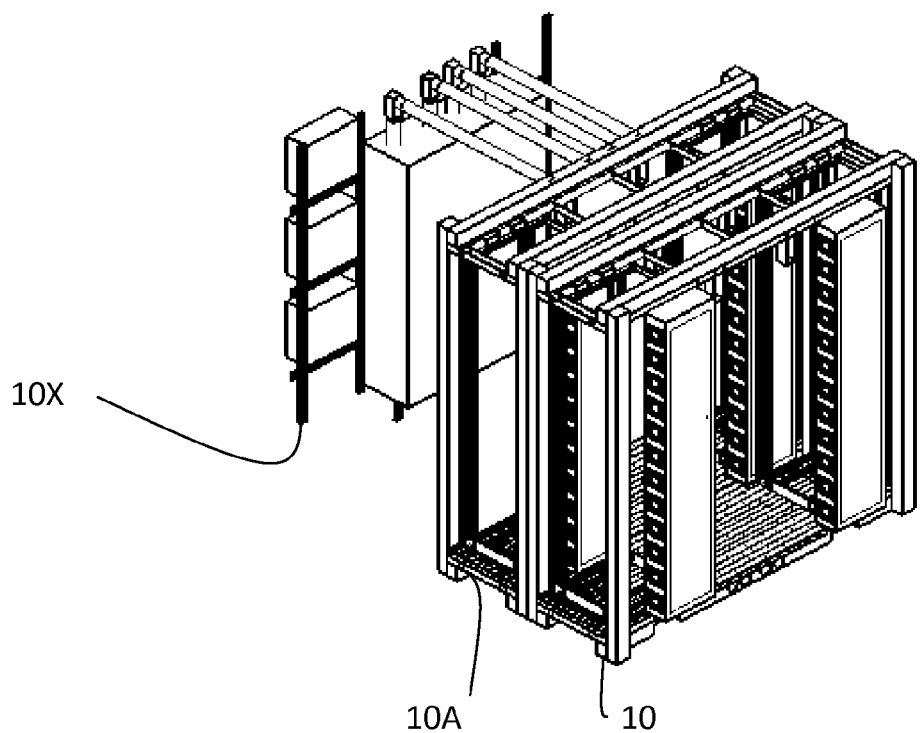
FIG. 7 is perspective view showing an assembly having two linked modules and a utility module.
Figure 8:
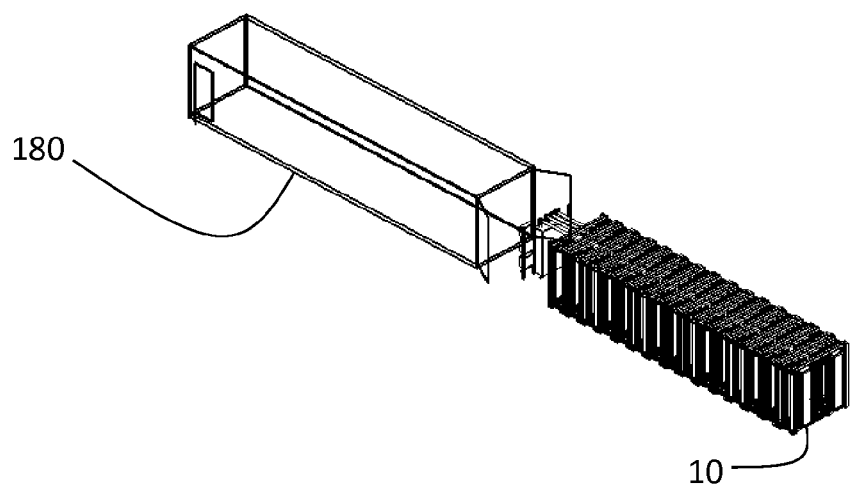
FIG. 8 is an exploded perspective view of one embodiment of the present invention showing several linked modules and a utility module, each of which are external of a container.

Turning now to FIGS. 7 and 8, it is seen that modules can be aligned end to end to form a modular structure of a desired length. In FIG. 7, two modules 10 and 10A are linked to a utility module. In FIG. 8, several modules are linked end to end in a configuration that can be selectively moved into a container 180 preferably after the linked modules are populated, wired and operational.

Figure 9:
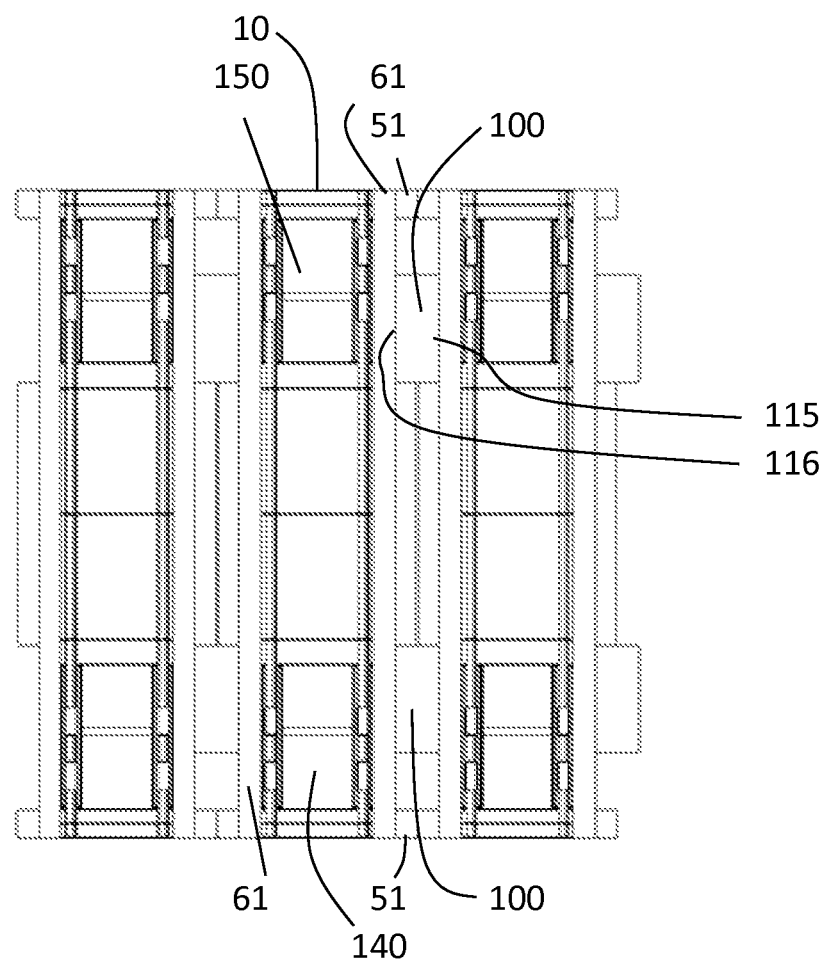
FIG. 9 is a top view showing several longitudinally linked modules.

Turning to FIG. 9, it is seen that the HVAC assemblies 100 are positioned between equipment racks of adjacent modules and are protected from being crushed and otherwise damaged. The HVAC assemblies 100 fit between and are thus encapsulated by the cross members 61 of adjacent modules allowing for the modules to be longitudinally linked without crushing the HVAC assemblies. In this regard, the distance between the sides 115 and 116 of the plenum 120 of the HVAC assembly 100 is equal to the distance between cross members 61 of adjacent modules. The distance between the sides 115 and 116 of the plenum 120 is also equal to the combined width of two adjacent and joined skeleton uprights 51.

Figure 10:
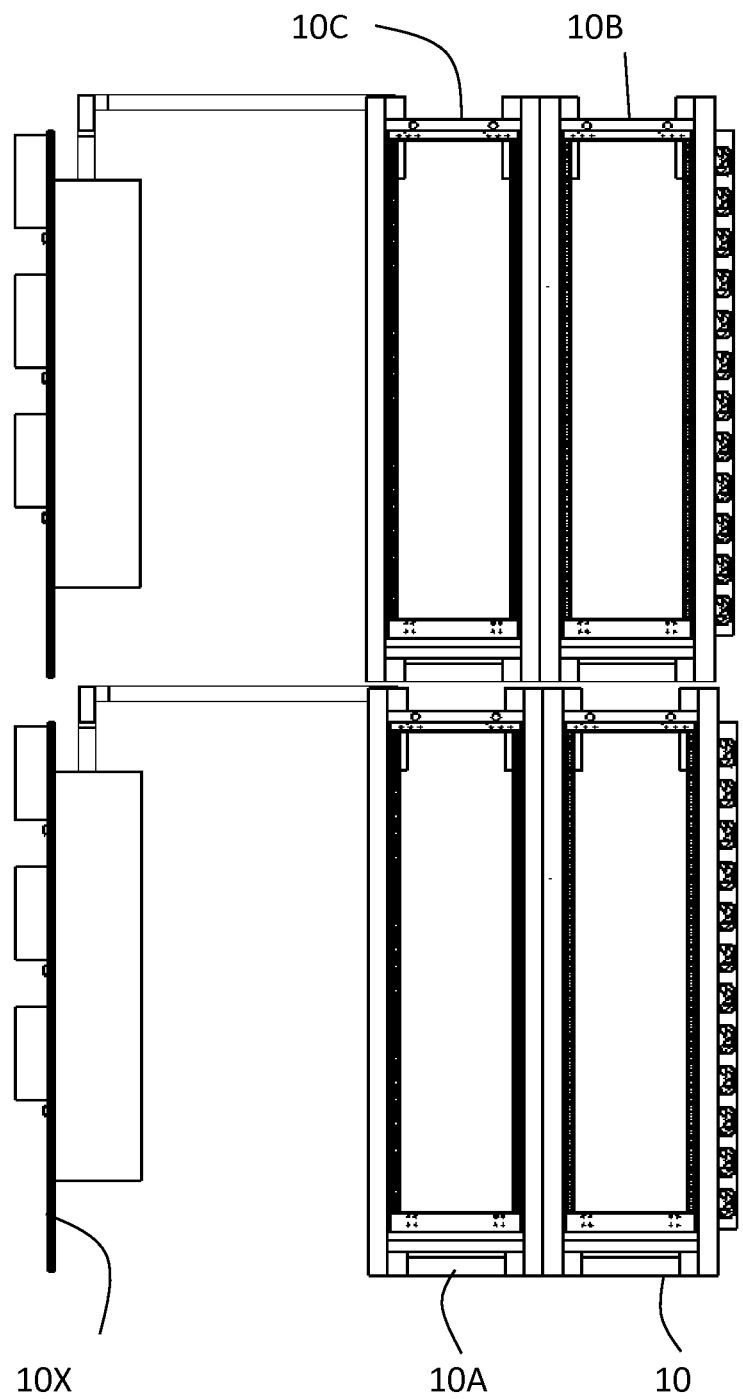
FIG. 10 is a side view of an assembly having both vertically stacked and longitudinally linked modules.

Looking now at FIG. 10, it is seen how modules can be vertically stacked. In this regard, the modules 10B and 10C can be secured on top of modules 10 and 10A. The skeleton uprights are load bearing members, which allow the modules to be stacked without crushing or otherwise damaging the contents within the modules. It is appreciated that this is just one alternative configuration possible due to the modular aspects of the present invention.

Figure 13:
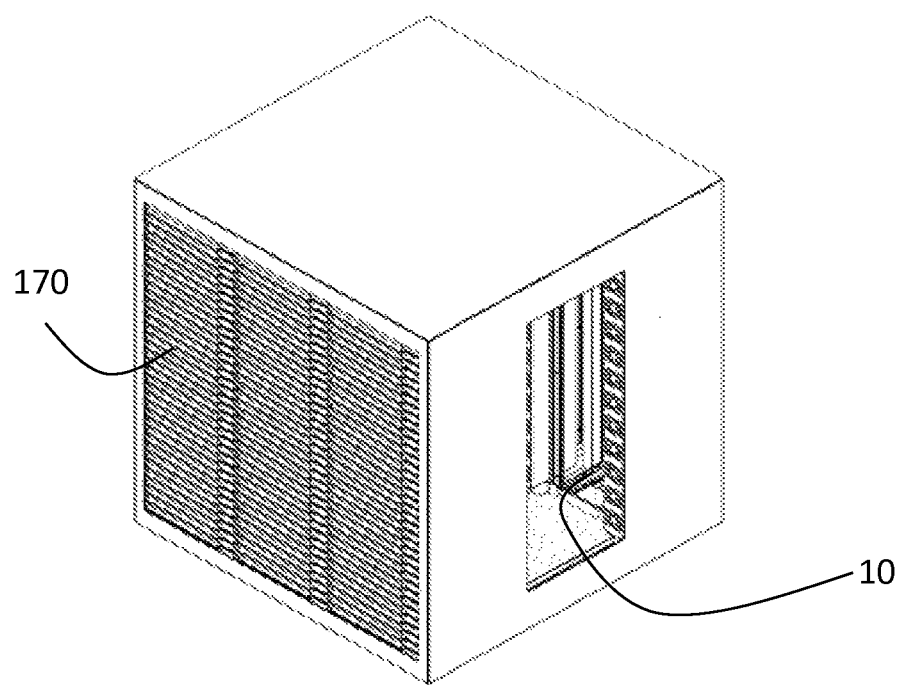
FIG. 13 is a perspective view showing modules clad with sheathing.

Looking now to FIG. 13, it is seen that walls, panels or sheathing 170 can be provided. The walls can contain insulation or material with other desirable attributes, namely noise reduction, protection from the elements and structural enhancement among others. The sheathing can be solid or can comprise dampers that can be selectively opened or closed to change between recirculation and fresh air operation. The sheathing can also have louvers for directing air flow. The sheathing can be attached to and supported by the skeleton 50. One preferred method of removably attaching the sheathing is with bolts. Sheathing can be used when the module 10 is intended for use as a stand-alone structure, as well as when the modules are scaled and housed in a container in order to act as a skin to maintain desired air flow characteristics.

It is appreciated that the equipment racks positioned in a highly dense manner. In one preferred embodiment, the equipment racks have a width of about 19 inches in order to accommodate a standard server width of up to approximately 17.7 inches, and the HVAC assemblies have a width of about 6 inches. This results in a ratio of equipment rack width to HVAC assembly width of greater that 3 to 1. Of course, it is understood that a greater or smaller ratio may be used without departing from the broad aspects of the present invention.

Thus it is apparent that there has been provided, in accordance with the invention, a high density modular cooling system and methods of operation thereof that fully satisfies the objects, aims and advantages as set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

I claim:

1. A cooling system comprising:
    a first module having:
        a foundation;
        a skeleton supported by said foundation defining an interior region interior of said skeleton and an exterior region exterior of said skeleton, said skeleton comprising at least one upright having an upright width;
        an HVAC assembly supported by said skeleton in said exterior region said HVAC assembly having at least one air mover that can move an amount of air generally perpendicular to said at least one upright, said HVAC assembly having a HVAC assembly width; and
        an equipment rack within said interior region,
    wherein said HVAC assembly width is approximately equal to or less than twice as wide as said upright width,
    wherein said first module is linkable with a second module whereby said HVAC assembly is encapsulated between said first module and said second module.

2. The cooling system of claim 1 wherein said skeleton comprises four uprights and two cross-members.

3. The cooling system of claim 2 wherein said four uprights and said two cross-members are load bearing structural members.

4. The cooling system of claim 3 wherein said HVAC assembly is adjacent one of said two cross-members.

5. The cooling system of claim 1 wherein:
    said HVAC assembly is a first HVAC assembly;
    said equipment rack is a first equipment rack; and
    said cooling system further comprises:
        a second HVAC assembly supported by said skeleton in said exterior region; and
        a second equipment rack within said interior region,
    wherein said first equipment rack and said second equipment rack define three thermally distinct aisles.

6. The cooling system of claim 5 wherein:
    said first HVAC assembly comprises:
        a first HVAC plenum;
        a first HVAC heat exchanger; and
        a first HVAC air mover comprised of said at least one air mover, and
    said second HVAC assembly comprises:
        a second HVAC plenum;
        a second HVAC heat exchanger; and
        a second HVAC air mover.

7. The cooling system of claim 6 wherein said first HVAC air mover and said second HVAC air mover are each selectably reversible, wherein said cooling system selectably has either:
    two cold aisles separated by a single hot aisle; or
    two hot aisles separated by a single cold aisle.

8. The cooling system of claim 1 wherein said equipment rack is supported on a translation assembly, wherein a lateral location of said equipment rack within said first module is selectable.

9. The cooling system of claim 1 wherein said first module has a first module structure and further comprising a second module of a structure similar to said first module structure, where said first module and said second module are joinable in a side to side relationship.

10. The cooling system of claim 9 wherein:
    said skeleton is a first module skeleton;
    said second module has second module skeleton; and
    said HVAC assembly is encapsulated between said first module skeleton and said second module skeleton and an air flow path as defined as passing through said HVAC assembly that is encapsulated between said first module skeleton and said second module skeleton, and then through said equipment rack is provided.

11. A cooling system comprising:
    a first module having:
        a first module skeleton defining a first skeleton interior region and a first skeleton exterior region;
        a first module first HVAC assembly supported by said first module skeleton in said first skeleton exterior region;
        a first module second HVAC assembly supported by said first module skeleton in said first skeleton exterior region;
        a first module first equipment rack within said first skeleton interior region; and
        a first module second equipment rack within said first skeleton interior region; and
    a second module having:
        a second module skeleton defining a second skeleton interior region and a second skeleton exterior region,
    wherein said first module is modularly linked to said second module in a manner whereby said first module first HVAC assembly and said first module second HVAC assembly are encapsulated between said first module skeleton and said second module skeleton,
    wherein:
    said first module skeleton has first skeleton uprights; and
    said second module skeleton has second skeleton uprights,
        whereby said first skeleton uprights contact said second skeleton uprights whereby said first module skeleton and said second module skeleton define an area for said first module first HVAC assembly and said first module second HVAC assembly to be encapsulated.

12. The cooling system of claim 11 wherein said first module first equipment rack and said first module second equipment rack define three thermally distinct aisles.

13. The cooling system of claim 12 wherein said first module further comprises:
    a first translation assembly supporting said first module first equipment rack;
    a second translation assembly supporting said second module second equipment rack, wherein said first translation assembly and said second translation assembly determine a relative size of each of said three thermally distinct aisles.

14. The cooling system of claim 12 wherein said three thermally distinct aisles comprise:
    one hot aisle separated by two cold aisles; or
    one cold aisle separated by two hot aisles.

15. The cooling system of claim 11 further comprising a third module vertically connected to said first module and a fourth module connected to said first module in an side to side relationship.

16. A cooling system comprising:
a first module having:
  a foundation;
  a skeleton supported by said foundation defining an interior region interior of said skeleton and an exterior region exterior of said skeleton;
  a first HVAC assembly supported by said skeleton in said exterior region, said first HVAC assembly comprising:
    a first HVAC plenum;
    a first HVAC heat exchanger; and
    a first HVAC air mover;
  a first equipment rack within said interior region;
  a second HVAC assembly supported by said skeleton in said exterior region, said second HVAC assembly comprising:
    a second HVAC plenum;
    a second HVAC heat exchanger; and
    a second HVAC air mover; and
  a second equipment rack within said interior region,
wherein:
  said first equipment rack and said second equipment rack define three thermally distinct aisles;
  said first HVAC air mover and said second HVAC air mover are each selectably reversible; and
  said cooling system selectably has either:
    two cold aisles separated by a single hot aisle; or
    two hot aisles separated by a single cold aisle.

17. A cooling system comprising:
a first module having a first module structure comprising:
  a foundation;
  a first module skeleton supported by said foundation defining an interior region interior of said first module skeleton and an exterior region exterior of said first module skeleton;
  an HVAC assembly supported by said first module skeleton in said exterior region; and
  an equipment rack within said interior region; and
a second module of a structure similar to said first module structure, wherein said first module and said second module are joinable in a side to side relationship,
wherein:
  said second module has second module skeleton;
  said HVAC assembly is encapsulated between said first module skeleton and said second module skeleton; and
  an air flow path as defined as passing through said HVAC assembly that is encapsulated between said first module skeleton and said second module skeleton, and then through said equipment rack is provided.

18. A cooling system comprising:
a first module having:
  a first module skeleton defining a first skeleton interior region and a first skeleton exterior region;
  a first module first HVAC assembly supported by said first module skeleton in said first skeleton exterior region;
  a first module second HVAC assembly supported by said first module skeleton in said first skeleton exterior region;
  a first module first equipment rack within said first skeleton interior region; and
  a first module second equipment rack within said first skeleton interior region; and
a second module having:
  a second module skeleton defining a second skeleton interior region and a second skeleton exterior region,
wherein said first module is connected to said second module in a manner whereby said first module first HVAC assembly and said first module second HVAC assembly are encapsulated between said first module skeleton and said second module skeleton,
wherein said first module first equipment rack and said first module second equipment rack define three thermally distinct aisles; and
wherein said first module further comprises:
  a first translation assembly supporting said first module first equipment rack;
  a second translation assembly supporting said first module second equipment rack, wherein said first translation assembly and said second translation assembly determine a relative size of each of said three thermally distinct aisles.

19. A cooling system comprising:
a first module having:
  a first module skeleton defining a first skeleton interior region and a first skeleton exterior region;
  a first module first HVAC assembly supported by said first module skeleton in said first skeleton exterior region;
  a first module second HVAC assembly supported by said first module skeleton in said first skeleton exterior region;
  a first module first equipment rack within said first skeleton interior region; and
  a first module second equipment rack within said first skeleton interior region; and
a second module having:
  a second module skeleton defining a second skeleton interior region and a second skeleton exterior region,
wherein said first module is connected to said second module in a manner whereby said first module first HVAC assembly and said first module second HVAC assembly are encapsulated between said first module skeleton and said second module skeleton;
wherein said first module first equipment rack and said first module second equipment rack define three thermally distinct aisles wherein said three thermally distinct aisles comprise:
  one hot aisle separated by two cold aisles; or
  one cold aisle separated by two hot aisles.

* * * * *